United States Patent
Piasecki et al.

(10) Patent No.: US 6,950,047 B1
(45) Date of Patent: Sep. 27, 2005

(54) METHOD AND APPARATUS FOR COMBINING OUTPUTS OF MULTIPLE DACS FOR INCREASED BIT RESOLUTION

(75) Inventors: Douglas Piasecki, Austin, TX (US); James Dub Austin, Austin, TX (US); Douglas Holberg, Wimberley, TX (US); Kenneth Fernald, Austin, TX (US)

(73) Assignee: Silicon Labs CP, Inc., Austin, TX (US)

( * ) Notice: Subject to any disclaimer, the term of this patent is extended or adjusted under 35 U.S.C. 154(b) by 0 days.

(21) Appl. No.: 10/816,436

(22) Filed: Mar. 31, 2004

(51) Int. Cl.$^7$ ............................................. H03M 1/20
(52) U.S. Cl. ........................ 341/131; 341/144; 341/136
(58) Field of Search ................................. 341/131, 144, 341/120, 136, 133

(56) References Cited

U.S. PATENT DOCUMENTS

| | | | |
|---|---|---|---|
| 5,574,455 A * | 11/1996 | Hori et al. .................. 341/144 |
| 6,703,956 B1 * | 3/2004 | Mueller et al. ............. 341/145 |
| 6,720,898 B1 * | 4/2004 | Ostrem ........................ 341/144 |
| 6,727,834 B2 * | 4/2004 | Roberts et al. ............. 341/143 |
| 6,738,006 B1 * | 5/2004 | Mercer et al. .............. 341/144 |

* cited by examiner

Primary Examiner—Lam T. Mai
(74) Attorney, Agent, or Firm—Howison & Arnott, L.L.P.

(57) ABSTRACT

Method and apparatus for combining outputs of multiple DACs for increased bit resolution. A method for providing an increased bit resolution to a data converter operable to convert digital information to analog values. A first current Digital-to-Analog (IDAC) converter is controlled to provide current to a first output node, the first IDAC having a first current step size associated with the Least Significant Bit (LSB) thereof. A second IDAC is controlled to provide current to the first output node, the second IDAC having a second current step size associated with the LSB thereof that is smaller than the first current step size. The combination of the first and second IDACs increases the bit resolution of the first IDAC when driving the first output node with the second IDAC.

33 Claims, 4 Drawing Sheets

METHOD AND APPARATUS FOR COMBINING OUTPUTS OF MULTIPLE DACS FOR INCREASED BIT RESOLUTION

TECHNICAL FIELD OF THE INVENTION

The present invention relates in general to data converters for converting digital information to analog information and, more particularly, to a digital-to-analog converter (DAC) utilized in a mixed signal processor wherein the output of multiple current DACs are combined to increase the bit resolution of the mixed signal processor.

CROSS-REFERENCE TO RELATED APPLICATIONS

N/A.

BACKGROUND OF THE INVENTION

Digital-to-analog converters (DACs) are operable to convert a digital value to an analog value. The DAC has a bit-resolution which defines the smallest step size that it can increment. For example, a 12-bit current DAC allows for 4096 discrete steps. This would result in a current DAC operating on a 2 mA full scale current to have a current of 1 mA for the most significant bit (MSB) and a current of 488 nA as the highest resolution associated with the least significant bit (LSB). If the full scale current is decreased by a factor of two, that will decrease the size of the LSB step correspondingly, but it will not decrease or increase the number of current steps that can be provided by the current DAC. The only way to increase the number of steps is to increase the bit-resolution of the DAC, which requires a more complex current DAC architecture. Along with this more complex architecture comes more linearity problems, etc.

SUMMARY OF THE INVENTION

The present invention disclosed herein comprises in one aspect thereof, a method for providing an increased bit resolution to a data converter operable to convert digital information to analog values. A first current Digital-to-Analog (IDAC) converter is controlled to provide current to a first output node, the first IDAC having a first current step size associated with the Least Significant Bit (LSB) thereof. A second IDAC is controlled to provide current to the first output node, the second IDAC having a second current step size associated with the LSB thereof that is smaller than the first current step size. The combination of the first and second IDACs increases the bit resolution of the first IDAC when driving the first output node without the second IDAC.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
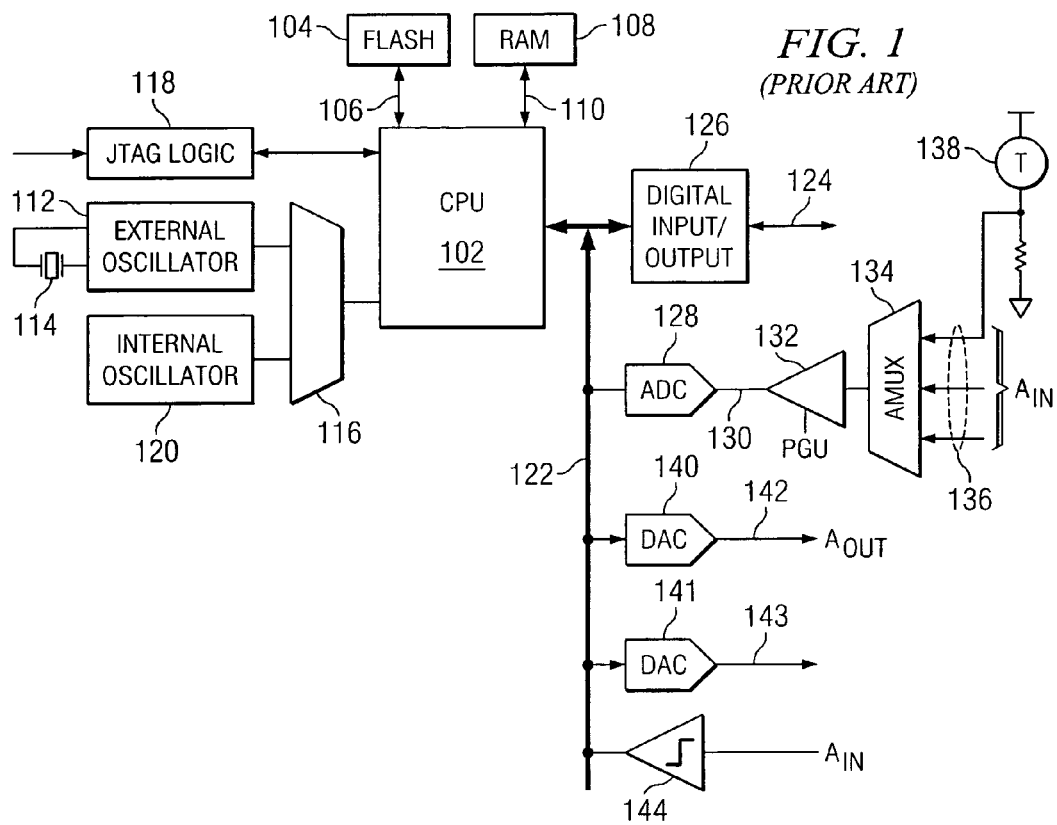
FIG. 1 illustrates a logic block diagram of a mixed signal multiprocessor unit.

Referring now to FIG. 1, there is illustrated a block diagram of a mixed signal integrated circuit including a SAR analog-to-digital converter (ADC). This is a conventional processor based mixed signal circuit of the type C8051F410, manufactured by Silicon Laboratories, the present assignee. This mixed signal circuit includes at the heart thereof a CPU 102, which is an 8051 CPU, a conventional processor core. This CPU 102 interfaces with memory, there being a flash memory 104 interfaced with the CPU 102 through a bus 106, and a random access memory (RAM) 108 interfaced to the CPU 102 through a bus 110.

The CPU 102 operates on multiple clocks. There is provided an external oscillator circuit 112, which is operable to be controlled by an external crystal 114, it being noted that the external oscillator circuit 112 is actually disposed on-chip. This oscillator is a high frequency oscillator and operates at a frequency of around 25 MHz. This is input to the CPU 102 through a selection multiplexer (MUX) 116. Alternatively, the CPU 102 can operate off of a low frequency internal oscillator 120, this being a 32 KHz crystal oscillator. Typically, the primary processing function of the CPU 102 is carried out with the high frequency oscillator 112 and, when the CPU 102 is placed in a "sleep" mode, the lower frequency oscillator is utilized. The processing operations are typically minimal at the lower frequency. The CPU 102 also includes a JTAG logic block 118 that is operable to interface external data with the CPU 102 for writing in the flash memory 104, this being a conventional operation.

The CPU 102 interfaces with a digital on-chip bus 122, which interfaces with a plurality of digital input/output pins 124 through a digital I/O block 126. This digital I/O block 126 is operable to allow various digital interfaces. This can be parallel digital data or it can be serial data. Serial data will typically be interfaced with some type of serial data format. This can be an RS232 data format, an I²C format, or any other type of serial data format. This allows digital data to be received or transmitted. Additionally, the digital bus 122 is interfaced with the digital input of an analog-to-digital converter (ADC) 128 to receive digital data therefrom. The input to the ADC 128 is provided on an input analog line 130, which comprises the output of the programmable amplifier 132. The analog input to the amplifier 132 is received from the analog multiplexer 134, which receives a plurality of analog inputs on analog input lines 136. These analog inputs can be received from any source, such as transducers, etc. One embodiment of this analog multiplexer is illustrated in U.S. Pat. No. 6,507,215, issued Jan. 14, 2003, and assigned to the present Assignee, which reference is incorporated herein in its entirety by reference. One illustrated input to the multiplexer 134 is from a temperature sensor 138, which is an internally generated temperature value typically generated from a band-gap reference voltage generator contained on-chip. The output of this temperature sensor is connected to one of the analog input lines 136 and is selected for measuring ambient temperature of the chip, which may be the ambient temperature of the surroundings.

In addition to the analog multiplexer 134 and the ADC 128, digital information on the bus 122 can be provided as the input to one of either a digital-to-analog converter (DAC) 140 or a DAC 141, for conversion thereof to an analog output signal on respective analog output lines 142 and 143. The comparator function is provided by a comparator 144 which receives an analog input for comparison to an internally generated reference voltage or to an external reference voltage (not shown) to provide a selectable output that can be driven to the digital bus 122 or to an interrupt input on the CPU 102. Although illustrated as being connected to the digital bus 122, it should be understood that the output of comparator 144 could be connected to multiple different interrupts on the processor.

Figure 2:
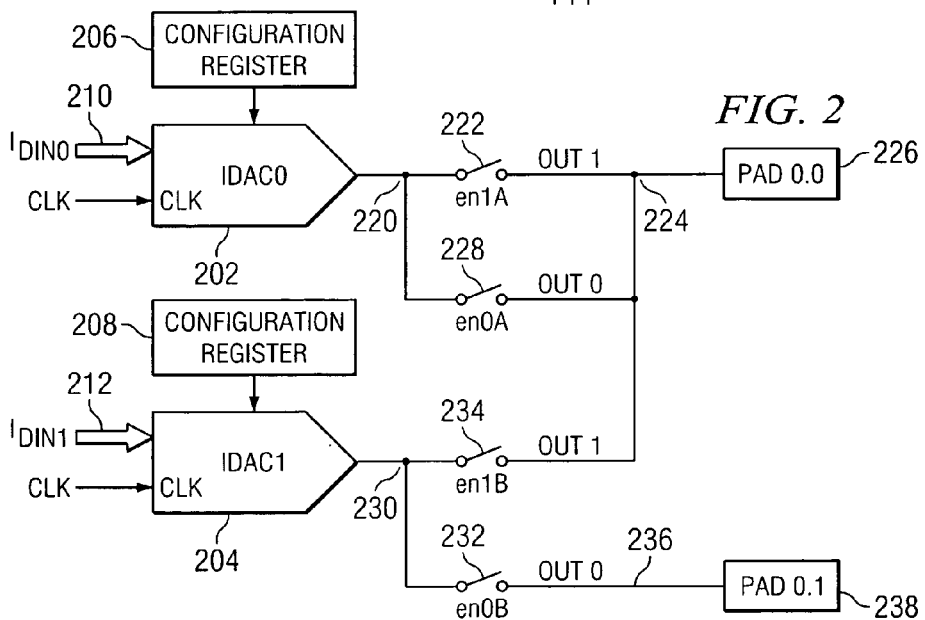
FIG. 2 illustrates a logic block diagram of two DACs and associated switches to allow the combining of the outputs thereof.

Referring now to FIG. 2, there is illustrated a logic diagram for two DACs, a DAC 202 and a DAC 204, DAC 202 labeled IDAC0 and DAC 204 labeled IDAC 1, both of these DACs 202 and 204 being current DACs, such that the output thereof is a current. Each of the DACs 202 and 204 are configured with a separate configuration register 206 for DAC 202 and configuration register 208 for DAC 204. The configuration registers 206 and 208 set the gain and full scale current for each of the DACs 202 and 204. DAC 202 receives a digital input value on a digital input bus 210 and DAC 204 receives a digital input value on a bus 212. Both of the DACs 202 are clocked with a clock signal CLK. It is noted that both of the DACs 202 and 204 are operated on the same clock and that they are both operated within and under the control of the operation of the CPU 202. Therefore, both of the DACs 202 and 204 can receive updates at the same time. The driver output of each of the DACs is a current drive from a p-channel driver, as will be described herein below, such that current can only be driven to the output node.

DAC 202 is operable to drive a node 220. Node 220 is connected to one side of a switch 222, the other side thereof connected to an output node 224 that is connected to a pad 226. This pad 226 is associated with the DAC 202 in normal operation with single DAC operation. Node 220 is additionally connected to one side of a switch 228, the other side thereof connected to node 224. Switch 222 is controlled by a first enable signal, en1A, and switch 228 is controlled by an enable signal, en0A.

The output of the DAC 204 has the output thereof connected to a node 230, node 230 connected to one side of a switch 232 and to one side of a switch 234. Switch 232 has the other side thereof connected to an output node 236, node 236 connected to an output pad 238, output pad 238 associated with the DAC 204 in single DAC operation. The other side of the switch 234 is connected to the node 224, such that the output node 230 can be routed to the pad 226 in dual-DAC operation, this being the combination of DAC outputs. The switch 232 is enabled by the enable signal, en0B, and switch 234 is enabled by the enable signal, en1B. In the dual-DAC operation, when switch 222 and switch 234 are closed in response to the en1A and en1Bsignals being high, the output of both DACs 202 and 204 will be Wired ORed to the node 224. The DAC 202 is the primary DAC and the DAC 204 is the secondary DAC, but there is no reason that this could not be reversed. In general, when the DACs 202 and 204 are combined when the en1A and en1B signals are high, then the DAC 202 will constitute the higher order bits and the DAC 204 will constitute the lower order bits of the resultant DAC, as will be described in more detail herein below.

Figure 3:
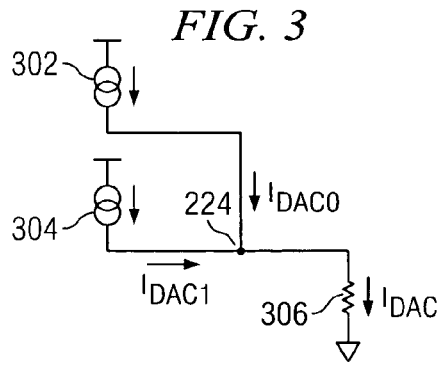
FIG. 3 illustrates a simplified schematic diagram of the Wired ORed operation.

Referring now to FIG. 3, there is illustrated a simplified schematic of the manner in which the two DACs 202 and 204 are combined. DAC 202 is represented by a current source 302 that drives the node 224 with the current from $V_{DD}$. Similarly, DAC 204 is represented by a current source 304 that drives current to the node 224 from the power supply. The pad 226 is represented by a load 306 that has the current $I_{DAC}$, the resultant current. As such, both of the DACs 202 and 204 are current sourcing DACs and cannot sink current. However, it should be understood that a current sinking DAC could be combined with one or both of the DACs 202 and 204 such that current is "pulled" from the node 224, or a DC load could be provided. This will be described in more detail herein below.

Figure 4:
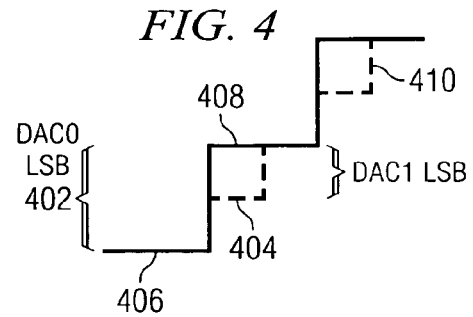
FIG. 4 illustrates a diagrammatic view of the improved bit-resolution provided by the second DAC.
Figure 5:
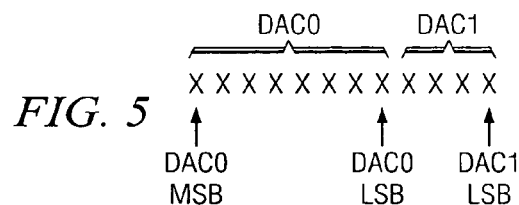
FIG. 5 illustrates a diagrammatic view of the bit-resolution pattern.

Referring now to FIG. 4, there is illustrated a diagrammatic view of the manner in which the two DACs 202 and 204 are combined. The first current DAC, current DAC 202, is configured such that it has a full scale current resulting in a minimum resolvable step associated with the LSB of a step size 402. The DAC 202 and the DAC 204 are basically identical DACs in the disclosed embodiment. However, they could be of a different bit resolution. For this example, both DACs 202 and 204 are n-bit DACs, such that they have $2^n$ levels that can be incremented from the minimum bit value to the highest bit value. A 12-bit current DAC, for example, would have 4096 levels that could be stepped through. In the current DAC 202, the full scale current is set such that the minimum current step would be current step 402. If current DAC 204 were set to one-half the full scale current, then the minimum current step size would be one-half that of the current DAC 202, this being represented by a current step 404. Therefore, it can be seen that a single current step 402 in the first current DAC, current DAC 202, would result in the output current changing from a current level 406 to a current level 408. If, thereafter, the current DAC 204 were incremented, this would provide an incremental current that would result in the output current incrementing to a current level 410, which would be one-half the current step size 402. This would, in effect, add an extra bit to the overall resolution of the combined current DAC, such that a 12-bit current DAC would then be converted to a 13-bit current DAC, with the LSB being defined by the LSB of the current DAC 204. This is illustrated in FIG. 5, wherein the first DAC is set to have 8 bits of resolution with the most significant bit to the least significant bit. Thereafter, the second current DAC, current DAC1, could have the four lower order bits therein exercised such that the 8 bit current DAC resolution of the first current DAC would be extended to 12 bits by only utilizing the four lower order bits in the second current DAC. Therefore, the lowest order bit in the second current DAC, current DACl, would constitute the LSB of the combined current DAC.

Figure 6:
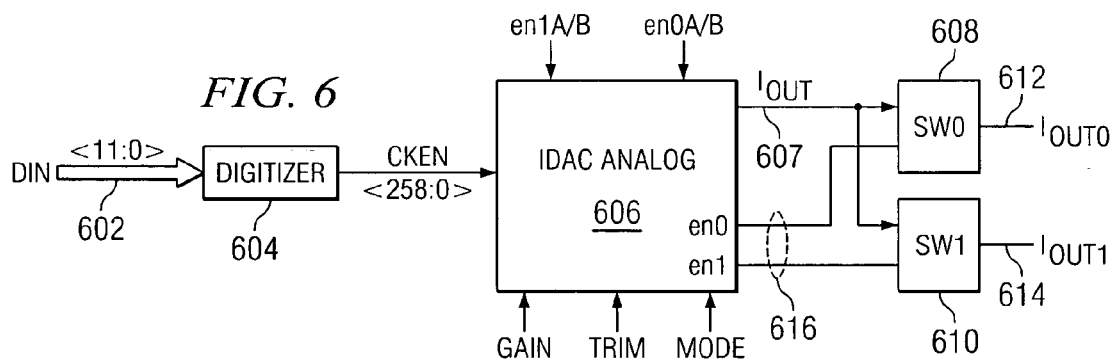
FIG. 6 illustrates a block diagram of one of the DACs at a high level.

Referring now to FIG. 6, there is illustrated a diagrammatic view of an overall 12-bit IDAC. Data is input on a 12-bit bus 602 having bits <11:0>, which is input to a digitizer 604 that is operable to clock data in, thermometer encode this input, and output 259 clocked control outputs into an analog IDAC 606. This digitizer 604 is a conventional IDAC circuit. The analog IDAC 606 is operable to receive, in addition to the clocked control signals, a gain input, a trim input and a mode input. In addition, there are provided two enable inputs, en1A/B and en0A/B, for enabling associated output switches. The IDAC 606 is operable to output, for a 12-bit resolution IDAC, 4096 levels of current on a current output line 607. This is input to a first switch 608 and a second switch 610 for providing a first output current on output 612 and a second output current on the second output 614, respectively. There are provided two enable outputs on line 616 for enabling two switches 608 and 610. Again, this is conventional IDAC operation with the exception of the switches 608 and 610.

Figure 7:
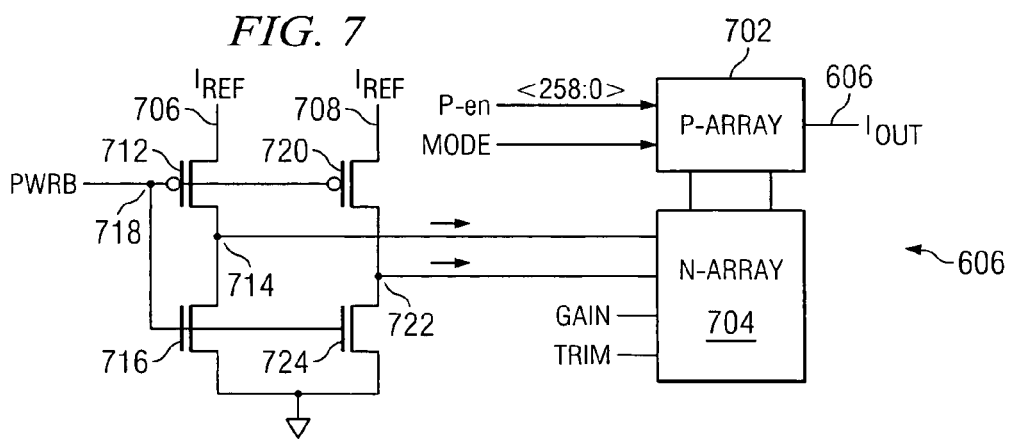
FIG. 7 illustrates a more detailed block diagram of the DAC.

Referring now to FIG. 7, there is illustrated a more detailed block diagram of the IDAC 606. In general, the IDAC 606 is comprised of a p-array 702 of p-channel transistors for driving current to the output line 607 from the power supply and an n-array 704 for providing bias current to the p-array 702. The p-array 702 is operable to receive the mode input and the clocked control signals for selecting levels, with the n-array 704 operable to determine a gain and also provide the trim function associated therewith. A reference current, $I_{REF}$, is provided on two current input lines 706 and 708. Line 706 is connected to one side of the source/drain path of a p-channel transistor 712, the other side thereof connected to a node 714. The node 714 is connected to one side of the source/drain path of an n-channel transistor 716, the other side thereof connected to ground. The gates of transistors 712 and 714 are connected to a control node 718 which is operable to provide a power-up signal of pwrb, which when low, will turn on transistor 712 and turn off transistor 716. This will allow the reference current on node 706, approximately 4 µA, to flow to node 714, which node 714 is connected to one input of the n-array 704. The line 708 operates similarly and is connected to one side of a source/drain path of a p-channel transistor 720, the other side thereof connected to a node 722, node 722 connected to one side of the source/drain path of an n-channel transistor 724, the other side thereof connected to ground. The gates of transistors 720 and 722 are connected to the node 718 to receive the signal pwrb. Node 722 is input to the n-array 704.

Figure 8:
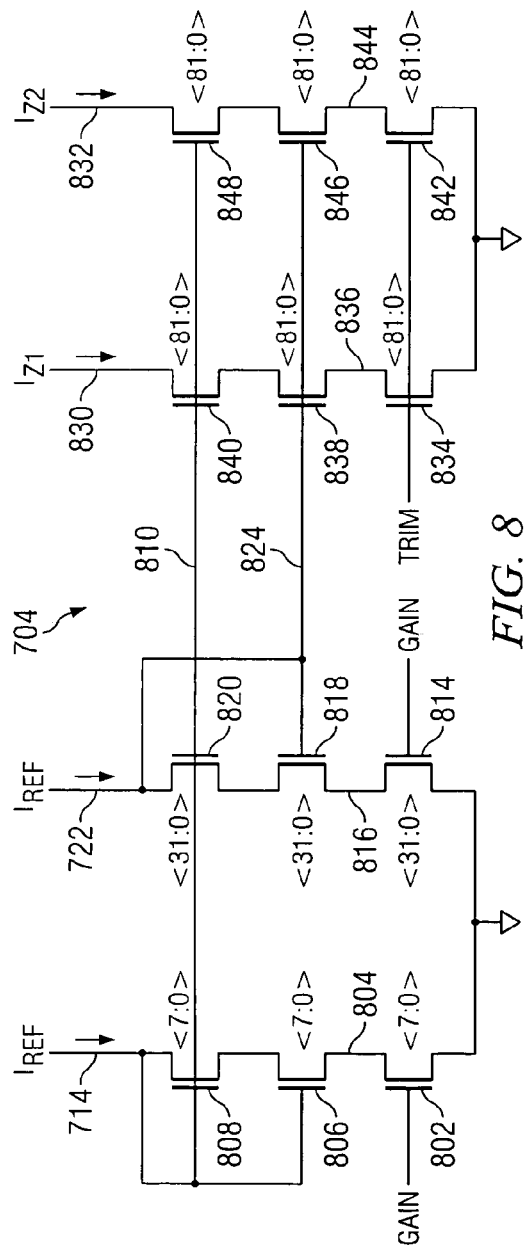
FIG. 8 illustrates a schematic diagram of the n-channel transistor portion of the DAC.

Referring now to FIG. 8, there is illustrated a detailed schematic diagram of the n-array 704. The current input to the node 714 is input to a first leg which is comprised of eight parallel legs, each comprised of a first n-channel transistor 802 connected between a node 804 and ground, the gate thereof connected to receive the gain signal. The node 804 is connected to one side of an n-channel transistor 806, the other side thereof connected to one side of the source/drain path of an n-channel transistor 808, the other side of the source/drain path of transistor 808 connected to the node 714. The gates of transistors 806 and 808 are connected together and to node 714 and a node 810. Thus, the gain control signal on a gate of transistor 802 can determine how many legs are connected in parallel.

The current input node 722 is connected to 32 parallel legs, each of the 32 parallel legs comprised a first n-channel transistor 814 connected between a node 816 and ground, the gate thereof connected to the multibit gain control signal. Node 816 is connected to one side of the source/drain path of an n-channel transistor 818, the other side thereof connected to one side of the source/drain path of an n-channel transistor 820, the other side thereof connected to the node 722. The gate of transistor 818 is connected to node 824 and the gate of transistor 820 is connected to node 810. It can therefore be seen that the gain control signal controlling the gate of each of the transistors 814 in each of the 32 legs connected to node 722 will be able to determine the number of legs that are electrically connected to ground, this structure therefore setting the gain of the DAC.

The structure comprised of the two legs connected to nodes 714 and 722 allows for control of current that is mirrored over to a second structure. This second structure is comprised of two current legs, one associated with a current leg at a node 830 for driving a current $I_{Z1}$, to ground and a node 832 for driving a current $I_{Z2}$ to ground. Each of the legs associated with each of the nodes 830 and 832 has associated therewith 82 selectable legs. Each of the legs associated with the node 830 are comprised of a first n-channel transistor 834 connected between a node 836 and ground, the gate thereof connected to the multibit trim control signal. Node 836 is connected to one side of an n-channel transistor 838, the other side thereof connected to one side of an n-channel transistor 840, the other side thereof connected to node 830. The gate of transistor 838 is connected to node 824 and the gate of transistor 840 is connected to node 810. The leg associated with the node 832, there being 82 such legs, are each comprised of a first n-channel transistor 842 connected between a node 844 and ground, the gate thereof connected to the trim control signal. Node 844 is connected to one side of an n-channel transistor 846, the other side thereof connected to one side of an n-channel transistor 848, the other side thereof connected to node 832. The gate of transistor 846 is connected to node 824 and the gate of transistor 848 is connected to the node 810. In general, the operation of the n-array 704 of FIG. 8 provides that a 4 µA on each of the nodes 714 and 722. This current will be mirrored over to the legs associated with the nodes 830 and 832, with the gain control signal comprised of two bits. Each of the bits will control a certain number of the n-channel transistors 802 and 814. The gain control signal will select the number of transistors turned "on." The gain is set such that it will select a gain of "1," "½," "⅓" and "¼." The trim control signal on the transistors 834 and 842 is a 31-bit word which allows trimming of the current through the legs 830 and 832. Again, this is a conventional operation.

Figure 9:
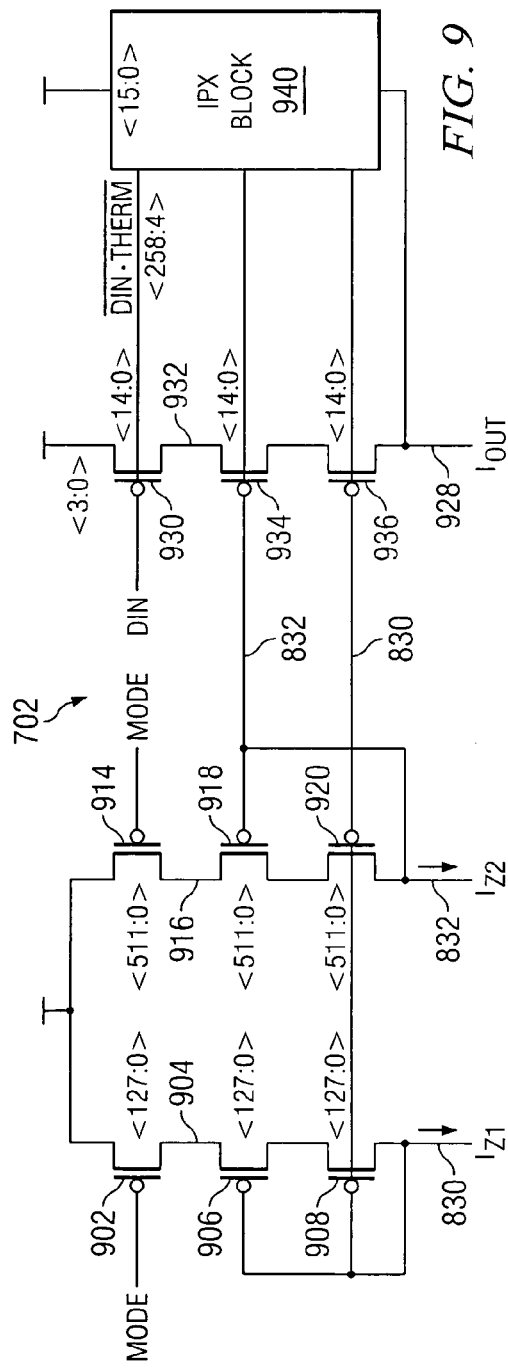
FIG. 9 illustrates a schematic diagram of the p-channel portion of the DAC.

Referring now to FIG. 9, there is illustrated a schematic diagram of the p-array 702. The p-array 702 is comprised of two primary multiple leg structures, one connected to node 830 and one connected to node 832. Each of the legs is comprised of multiple parallel connected legs, each leg comprised of series connected transistors. Each of the legs associated with the node 830, there being 128 of these legs, is comprised of a first p-channel transistor 902 having the source/drain path thereof connected between $V_{DD}$ and the node 904. Node 904 is connected to one side of the p-channel transistor 906, the other side thereof connected to one side of the source/drain path of a p-channel transistor 908, the other side thereof connected to the node 830. The gates of all the transistors 902 are enabled/disabled by the mode signal and the gates of all the transistors 906 and 908 are connected together to node 830. The second leg associated with the node 832, which is comprised of a plurality of legs, there being 512 of these legs, are each comprised of three series connected transistors. Each of these legs is comprised of a primary control p-channel transistor 914 connected between $V_{DD}$ and a node 916. Node 916 is connected to one side of a p-channel transistor 918, the other side thereof connected to one side of a p-channel transistor 920, the other side thereof connected to the node 832. The gate of transistor 918 is connected to node 832, and the gate of transistor 920 is connected to node 830. The gates of all of the transistors 914 are selectable in accordance with the mode signal. Each of the bits of the mode signal will select different groups of these transistors 914. These transistors 902 and 914 control the full scale setting of the IDAC, there typically being a current of 32 $\mu$A that can go through each of the legs associated with nodes 830 and 832.

The nodes 830 and 832 are mirrored over to a binary weighted leg. The binary weighted leg is comprised of 15 parallel legs connected between $V_{DD}$ and a node 928. Each of the legs is comprised of a primary control p-channel transistor 930 connected between $V_{DD}$ and a node 932. Node 932 is connected to one side of the p-channel transistor 934, the other side thereof connected to one side of a p-channel transistor 936, the other side thereof connected to the node 928. The gate of each of the transistors 930 is connected to the four LSBs of the din<11:0>(bit 0 to bit 1, bit 1 to bit 2, bit 2 to bit 4, bit 3 to bit 8), this primary leg able to select one of 15 different current levels, the gate of transistor 934 is connected to the node 832 and the gate of transistor 936 is connected to the node 832. The output on node 928 comprises the $I_{OUT}$ of the IDAC and this provides, depending upon the inputs, 4096 increments of current, the number thereof depending upon the input digital value. There is also provided a block 940 labeled the "IPX Block." This block 940 is comprised of a plurality of selectable groups of legs, each group comprised of 16 legs of transistors identical to the leg comprised of transistors 930, 934 and 936. Since there are 16 legs per group, selection of a group of these 16 legs will effectively provide a current step equal to 16 of the levels provided by one of the 15 legs of transistors 932, 934, and 936. For example, if one were to increment from a zero level up, one leg of the 15 legs of transistors 932, 934, and 936 would first be selected to increment from a zero level to the first level, i.e., the LSB. This will continue until all 15 of the legs of transistors 932, 934, and 936 are selected. All of the legs of transistors 932, 934, and 936 are then turned off and one of the groups of 16 legs in the block 940 is then selected to increment to 16 levels. Thereafter, the legs of transistors 932, 934, and 936 are then incrementally selected to go from 16 levels to 31 levels, and then the legs of transistors 932, 934, and 936 are turned off and another group of 16 legs selected in the block 940 to go to 32 levels.

Figure 10:
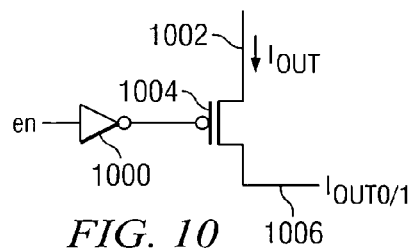
FIG. 10 illustrates a schematic diagram of one of the switches.

Referring now to FIG. 10, there is illustrated a simplified schematic diagram of each of the switches, which is operable to receive on an input 1002 the $I_{OUT}$ current from node 928 of the p-array 702. This is input to one side of a p-channel transistor 1004, the other side thereof connected to the output terminal on node 1006, this being the $I_{OUT}$ of either of the switches 608 or 610. The gate of transistor 1004 is connected to node 1008. Node 1008 is driven by inverter 1009. Inverter 1009 is connected to the enable signal. When enable is high, node 1008 is low, transistor 1004 is on and the switch is enabled. When enable is low, node 1008 is high, transistor 1004 is off, and it is not enabled, the switch is off.

In operation, the gain is determined with the two bit gain input to be either full gain, one-half gain, one-third gain or one-fourth gain, this being to scale. The mode is able to, through a 2-bit word, select four current levels for each gain level. Therefore, a plot of gain versus mode will provide the following values, as set forth in Table 1:

| Gain | Mode | | | |
|---|---|---|---|---|
| | <1, 1> | <1.0> | <0.1> | <0.0> |
| <0, 0> 1 | 2 mA | 1 mA | 500 $\mu$A | 250 $\mu$A |
| <0, 1> ½ | 1 mA | 500 $\mu$A | 250 $\mu$A | 125 $\mu$A |
| <1, 0> ⅓ | 666 $\mu$A | 333 $\mu$A | 166 $\mu$A | 83 $\mu$A |
| <1, 1> ¼ | 500 $\mu$A | 250 $\mu$A | 125 $\mu$A | 62.5 $\mu$A |

It can be seen that, for mode <1,1>, the IDAC will put out a full 2 mA of current at a gain of "1." For mode <1,1>, and at a gain of ¼, the current will be 500 $\mu$A. At the smallest full scale current, and the lowest gain, the full scale current will be 62.5 $\mu$A. By dividing the full scale current by the bit resolution, 4096 for a 12-bit IDAC, this will result in an LSB increment of 15 nA. If the first IDAC were set to a gain of 1 with a full scale current of 2 mA, the LSB current therefor would be 488 nA. Thus, by providing a second IDAC that can add current to the output node that provides increments of current that are lower than the lowest increment of current in the first IDAC, a high resolution IDAC can be realized.

Figure 11:
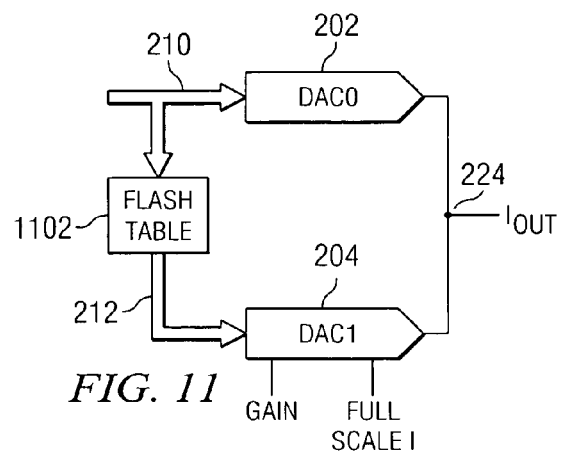
FIG. 11 illustrates a diagrammatic view of an alternate embodiment of the combined dual DACs illustrating the lineary compensation.

Referring now to FIG. 11, there is illustrated a logic diagram of an alternate method of utilizing the two IDACs. In this embodiment, there are illustrated the first IDAC 202 and a second IDAC 204 wherein the digital input to the second IDAC 204 is derived from a table 1102, this table typically stored in flash. This IDAC 204 is utilized to "correct" for nonlinearities or any correction on the output of the IDAC 202. Therefore, whenever a digital input value is input to the first IDAC 202 on the digital bus 210, this will address the flash table 1102 and output a pre-stored and associated digital value on the bus 212 for input to the second IDAC 204. The output of the IDAC 204 will provide a correction factor for the IDAC 202, this correction factor, as noted herein above, being an "additive" current. However, if the second IDAC 204 is implemented with an n-channel IDAC, current could be subtracted from the output of IDAC 202. Therefore, the IDAC 204 will not change the resolution of the DAC 202 but, rather, it will merely provide either an offset or a correction thereto. Additionally, the output of the IDAC 204 could be controlled by varying the gain and/or the full scale current.

Figure 12:
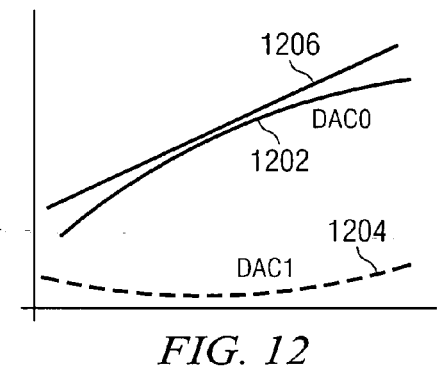
FIGS. 12 and 13 illustrate plots of linearity for the combined dual DACs of FIG. 2.
Figure 13:
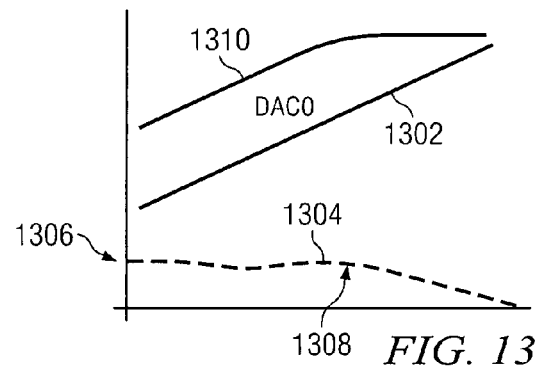

Referring now to FIG. 12, there is illustrated a plot of this correction. There is provided a first plot 1202 as a solid line for the output of the DAC 202 as a function of the 4096 levels for a 12-bit IDAC, in one example. It can be seen that the curve is nonlinear. There is provided a compensating plot 1204 that will provide a correcting aspect to this output, which will result in an offset plot which, when normalized, will result in a straight line 1206, which provides a linear output. In addition to providing a correction for nonlinearity, the second IDAC 204 could be programmed such that it would provide a filter correction or filter function to the overall output on node 224. Thus, it could be that the desired curve would need to be "rolled off" at the high end. In this example, the plot for the first IDAC is provided by plot 1302. A plot for the second IDAC, plot 1304 provides a plot which will provide an initial offset 1306 that will increase the current output thereof, which current will begin to decrease at a point 1308. The total current for the total IDAC output will appear as plot 1310. As such, it can be seen that with the use of the flash table 1102, the overall IDAC response can be modified for each digital input value varied through the use of a look up table to add current to the node 224. Also, as noted herein above, an n-channel IDAC could be utilized in addition thereto in order to actually subtract current at certain digital values.

Figure 14:
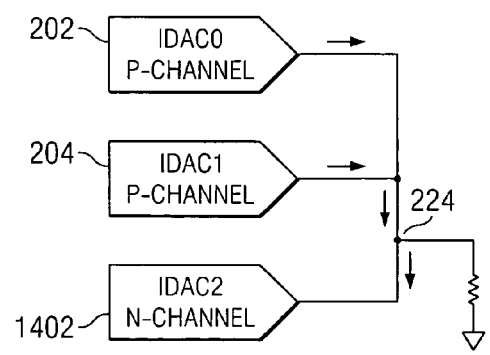
FIG. 14 illustrates an alternate embodiment wherein an n-channel pull-down DAC is provided.

Referring now to FIG. 14, there is illustrated an embodiment wherein there is provided the two IDACs 202 and 204, these both being p-channel IDACs that drive current to the node 224. There is provided in addition, an n-channel IDAC 1402 that is operable to sink current therefrom. Although not disclosed in detail, this is the parallel of the p-channel IDAC.

Although the preferred embodiment has been described in detail, it should be understood that various changes, substitutions and alterations can be made therein without departing from the spirit and scope of the invention as defined by the appended claims.

What is claimed is:

1. A method for providing an increased bit resolution to a data converter operable to convert digital information to analog values, comprising the steps of:

controlling in a first step of controlling a first current Digital-to-Analog (IDAC) converter to provide a first current through a first output node, the first IDAC having a first current step size associated with the Least Significant Bit (LSB) thereof; and controlling in a second step of controlling a second IDAC to provide a second current through the first output node, the second IDAC having a second current step size associated with the LSB thereof that is smaller than the first current step size;

wherein the current through the first output node is the sum of the first and second currents;

wherein the combination of the first and second IDACs increases the bit resolution of the first IDAC when driving the first output node with the addition of the second IDAC.

2. The method of claim 1, and further controlling the second IDAC to not provide current to the first output node.

3. The method of claim 1, wherein the outputs of the first and second steps of controlling are operable to Wire OR the outputs of both of the first and second IDACs to the first output node.

4. The method of claim 3, wherein the second step of controlling is operable to selectively control the second IDAC to provide current to the first output node in a first and combination mode and to provide current to a second and separate output node in a second and non-combination mode.

5. The method of claim 1, wherein the first and second IDACs drive current to the first output node in a current sourcing operation.

6. The method of claim 1, wherein at least one of the first and second IDACs is operable to sink current from the first output node.

7. The method of claim 1, wherein the first and second IDACs each have a length "n" with there being $2^n$ levels of current separated by the first current size and second current size, respectively.

8. The method of claim 7, wherein the combination of the first and second IDACs provides a combined IDAC with a length of n+log$_2$(m), wherein m is equal to the ratio of the first step size to the second step size.

9. The method of claim 7, wherein the second IDAC has a smaller gain than the first IDAC.

10. The method of claim 7, wherein the second IDAC has a full scale current that is less than the full scale current of the first IDAC.

11. The method of claim 7, wherein the second IDAC has a smaller gain than the first IDAC and a full scale current that is less than the full scale current of the first IDAC.

12. A method for processing digital data and providing that data to an output as analog data in the analog domain, comprising the steps of:

processing digital data with a central processing unit (CPU);

controlling with the CPU in a first step of controlling a first current Digital-to-Analog (IDAC) converter to convert a first digital value to a first current through a first output node representing an analog value in the analog domain, the first IDAC having a first current step size associated with the Least Significant Bit (LSB) thereof; and controlling with the CPU in a second step of controlling a second IDAC to convert a second digital value to a second current through the first output node representing an analog value in the analog domain, the second IDAC having a second current step size associated with the LSB thereof that is smaller than the first current step size;

wherein the current through the first output node is the sum of the first and second currents;

wherein the combination of the first and second IDACs increases the bit resolution of the first IDAC when driving the first output node with the addition of the second IDAC.

13. The method of claim 12, and further controlling the second IDAC with the CPU to not provide current to the first output node.

14. The method of claim 12, wherein the outputs of the first and second steps of controlling are operable to Wire OR the outputs of both of the first and second IDACs to the first output node.

15. The method of claim 14, wherein the second step of controlling is operable to selectively control the second IDAC to provide current to the first output node in a first and combination mode and to provide current to a second and separate output node in a second and non-combination mode.

16. The method of claim 12, wherein the first and second IDACs drive current to the first output node in a current sourcing operation.

17. The method of claim 12, wherein at least one of the first and second IDACs is operable to sink current from the first output node.

18. The method of claim 12, wherein the first and second IDACs each have a length "n" with there being $2^n$ levels of current separated by the first current size and second current size, respectively.

19. The method of claim 18, wherein the combination of the first and second IDACs provides a combined IDAC with a length of n+log$_2$(m), wherein m is equal to the ratio of the first step size to the second step size.

20. The method of claim 18, wherein the second IDAC has a smaller gain than the first IDAC.

21. The method of claim 18, wherein the second IDAC has a full scale current that is less than the full scale current of the first IDAC.

22. The method of claim 18, wherein the second IDAC has a smaller gain than the first IDAC and a full scale current that is less than the full scale current of the first IDAC.

23. A mixed signal processor for processing digital data and providing that data to an output as analog data in the analog domain, comprising the steps of:

a central processing unit (CPU) for processing digital data;

a first current Digital-to-Analog (IDAC) converter operable to convert a first digital value to a first current for output to a first output representing an analog value in the analog domain, the first IDAC having a first current step size associated with the Least Significant Bit (LSB) thereof;

a second IDAC operable to convert a second digital value to a second current for output to a second output representing an analog value in the analog domain, the second IDAC having a second current step size associated with the LSB thereof that is smaller than the first current step size;

a switching device for routing said first and second outputs to a first output node;

wherein the current through said first output node is the sum of the first and second currents;

wherein the combination of the first and second IDACs increases the bit resolution of said first IDAC when driving said first output node with the addition of said second IDAC.

24. The mixed signal processor of claim 23, said switching device operable to inhibit said second IDAC from providing current to said first output node.

25. The mixed signal processor of claim 23, wherein the outputs of both of the first and second IDACs are wired ORed to the first output node.

26. The mixed signal processor of claim 25, wherein said switch is operable to selectively control said second IDAC to provide current to said first output node in a first and combination mode and to provide current to a second and separate output node in a second and non-combination mode.

27. The mixed signal processor of claim 23, wherein said first and second IDACs drive current to said first output node in a current sourcing operation.

28. The mixed signal processor of claim 23, wherein at least one of said first and second IDACs is operable to sink current from said first output node.

29. The mixed signal processor of claim 23, wherein said first and second IDACs each have a length "n" with there being $2^n$ levels of current separated by the first current size and second current size, respectively.

30. The mixed signal processor of claim 29, wherein the combination of said first and second IDACs provides a combined IDAC with a length of $n+\log_2(m)$, wherein m is equal to the ratio of the first step size to the second step size.

31. The mixed signal processor of claim 29, wherein said second IDAC has a smaller gain than said first IDAC.

32. The mixed signal processor of claim 29, wherein said second IDAC has a full scale current that is less than the full scale current of said first IDAC.

33. The mixed signal processor of claim 29, wherein said second IDAC has a smaller gain than the said IDAC and a full scale current that is less than the full scale current of said first IDAC.

* * * * *